(12) United States Patent
Miu et al.

(10) Patent No.: US 6,556,737 B1
(45) Date of Patent: Apr. 29, 2003

(54) SILICON BULK-MICROMACHINED ELECTROMAGNETIC FIBER-OPTICS BYPASS MICROSWITCH

(75) Inventors: Denny K. Miu, Valencia, CA (US);
Weilong Tang, San Gabriel, CA (US);
Viktoria Temesvary, Los Angeles, CA (US); Brent E. Burns, Rancho Palos Verdes, CA (US)

(73) Assignee: Integrated Micromachines, Inc., Monrovia, CA (US)

( * ) Notice: Subject to any disclaimer, the term of this patent is extended or adjusted under 35 U.S.C. 154(b) by 89 days.

(21) Appl. No.: 09/705,416

(22) Filed: Nov. 2, 2000

Related U.S. Application Data

(63) Continuation-in-part of application No. 09/366,428, filed on Aug. 2, 1999.

(51) Int. Cl.[7] .................................................. G02B 6/42
(52) U.S. Cl. ........................... 385/16; 385/18; 359/196; 359/224
(58) Field of Search ............................. 385/15, 16, 18; 359/196, 198, 213, 224

(56) References Cited

U.S. PATENT DOCUMENTS

| | | |
|---|---|---|
| 4,317,611 A | 3/1982 | Petersen |
| 5,172,262 A | 12/1992 | Hornbeck |
| 5,543,956 A | 8/1996 | Nakagawa et al. |
| 5,606,447 A | 2/1997 | Asada et al. |
| 5,629,790 A | 5/1997 | Neukermans et al. |
| 5,778,513 A | 7/1998 | Miu et al. |
| 5,808,780 A * | 9/1998 | McDonald .................. 359/290 |
| 5,872,880 A | 2/1999 | Maynard |
| 5,960,132 A | 9/1999 | Lin ............................. 385/18 |
| 6,044,705 A | 4/2000 | Neukermans et al. .... 73/504.02 |
| 6,075,639 A | 6/2000 | Kino et al. |
| 6,337,760 B1 * | 1/2002 | Huibers et al. ............. 359/291 |

FOREIGN PATENT DOCUMENTS

| | | |
|---|---|---|
| EP | 0573267 A1 | 12/1993 |

OTHER PUBLICATIONS

Kiang et al., "Surface–Micromachined Electrostatic–Comb Driven Scanning Micromirrors For Barcode Scanners", University of California at Berkeley.

"Micromachined 1×2 Optical Fiber Switch"; Hewlett–Packard Laboratories; The 8th Conf. on Solid–state Sensors and Actuators, Jun. 25–29, 1995, pp. 344–347.

(List continued on next page.)

Primary Examiner—Rodney Bovernick
Assistant Examiner—Sung Pak
(74) Attorney, Agent, or Firm—Bever, Hoffman & Harms, LLP; Patrick T. Bever

(57) ABSTRACT

A fiber-optic microswitch is disclosed that includes a flexible mirror positioning structure including an outer fixed frame, a movable platform upon which a mirror is formed, and two or more resilient support members (e.g., monocrystalline silicon springs or torsion beams) connecting the movable platform to the fixed frame. Stationary fibers are mounted over the mirror. An electromagnetic drive mechanism is provided for positioning the movable platform relative to the fixed frame. The electromagnetic drive mechanism includes one or more coils formed on a drive substrate mounted under the monocrystalline structure, and one or more pole pieces that are mounted on the movable platform. Currents are selectively applied to the coils to generate attractive electromagnetic forces that pull the pole pieces, thereby causing the movable platform to move (e.g., tilt) relative to the fixed frame, thereby selectively directing light from one fiber to another. Various monocrystalline structures are disclosed.

12 Claims, 6 Drawing Sheets

OTHER PUBLICATIONS

"Realization of FDDI optical bypass switches using surface micromachining technology"; UCLA, pp. 1–9.

"Silicon–Based Moving–Mirror Optical Switch"; Mino F. Dautartas et al.; Journal of Lightwave Technology, vol. 10, No. 8, Aug. 1992, pp. 1078–1085.

"Self–Aligned Optical Subassembly for Multi–Mode Devices", Mino F. Dautartas, IEE, Part, B, vol. 18, No. 3, Aug. 1995, pp. 552–557.

"New Type of Fiber Optic Connector Designed for Military Optical Backplanes", R.J. Pimpinella, IEEE, vol. 15, No. 6, Dec. 1992, pp. 992–997.

"Fiber–optic 1×6 switch with smooth transmission spectrum", H. Gnewuch, et al., Sensors and Actuators (1994), pp. 109–114.

* cited by examiner

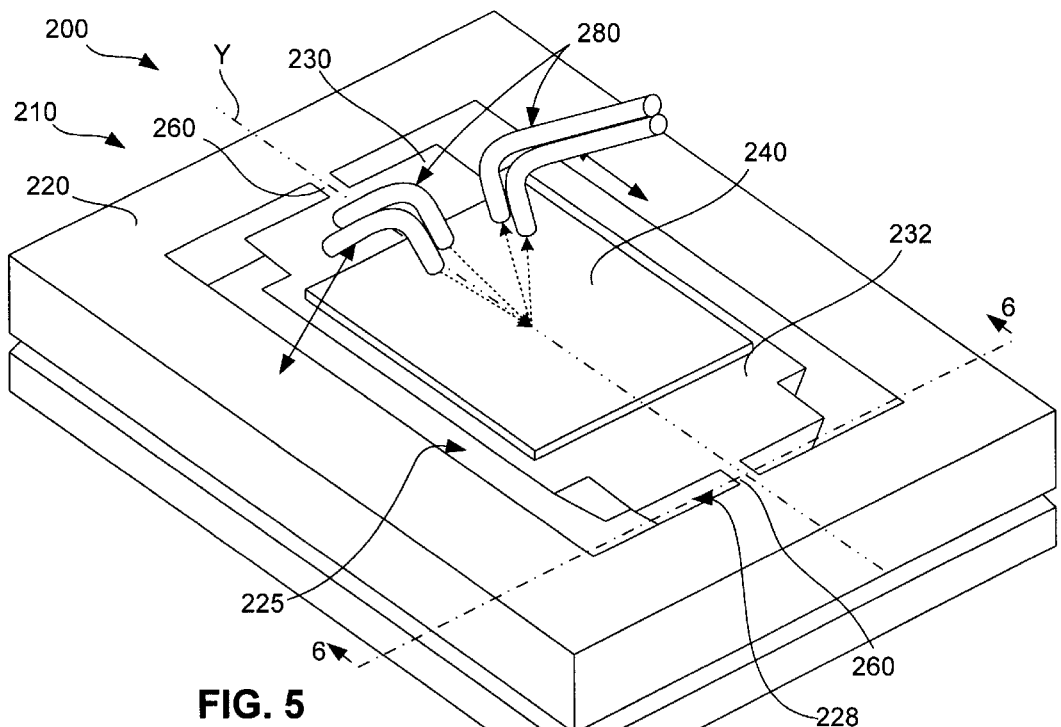
FIG. 5
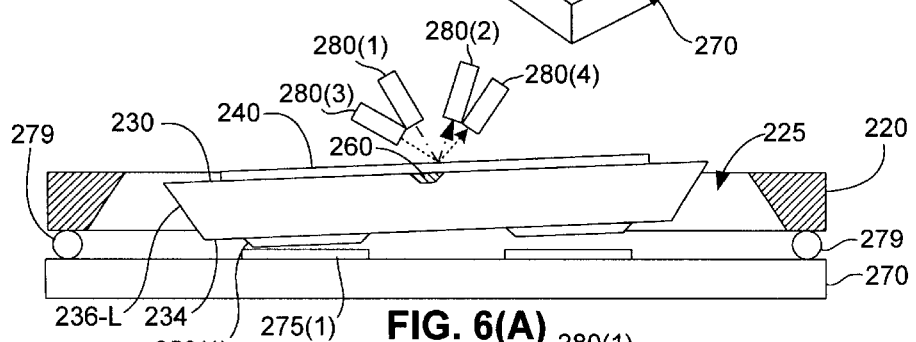
FIG. 6(A)
FIG. 6(B)

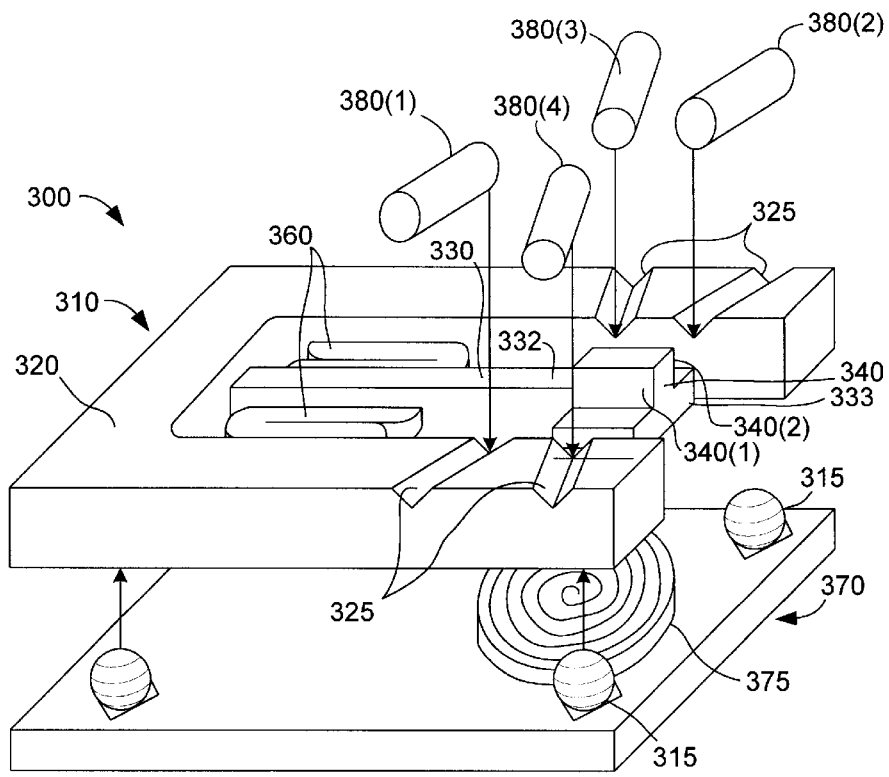
FIG. 7
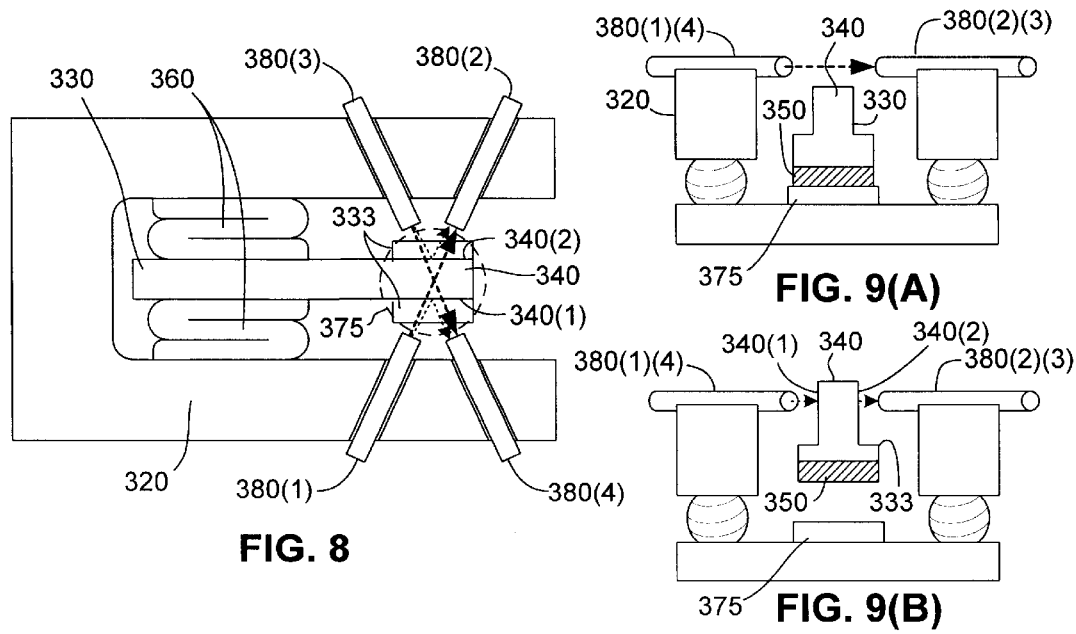
FIG. 8
FIG. 9(A)
FIG. 9(B)

SILICON BULK-MICROMACHINED ELECTROMAGNETIC FIBER-OPTICS BYPASS MICROSWITCH

RELATED APPLICATIONS

The present application is a continuation-in-part of co-owned and co-pending U.S. patent application Ser. No. 09/366,428 ("the '428 application"), which was filed on Aug. 2, 1999.

FIELD OF USE

The present invention relates to fiber-optics switches, in more particularly to fiber-optics switches incorporating bulk-micromachined mirror support structures.

BACKGROUND ART

Fiber-optics is used as the transmission medium in many high-speed local-area communication networks. Typically, in these networks, all devices (including concentrators, bridges, routers, and workstations) are coupled in a ring-like fashion through specially designed bypass switches. In case of power or equipment failure or routine station removal, a selected bypass switch is actuated to de-couple a selected device from the network in order to prevent any unwanted disruption or compromise on the system performance.

FIG. 1 is a block diagram showing a fiber-optics high-speed local-area communication network 10 that includes several devices (DEVICE 1 through DEVICE 6) and corresponding bypass switches (SW1 through SW6). Each device includes a reception port R for receiving data from network 10, and a transmission port T for transmitting data onto network 10. Each switch is controlled by control signals to either couple its corresponding device to network 10, or to de-couple its corresponding device from network 10. For example, referring to switch SW1 in FIG. 1, DEVICE 1 is coupled to network 10 because data is directed by switch SW1 from a network fiber F1 to a device receiver fiber F2, and data from the associated device is directed to network 10 from a device transmission fiber F3 to a network fiber F4. Conversely, referring to switch SW2 in FIG. 1, DEVICE 2 is de-coupled from network 10 because data is directed by switch SW1 from network fiber F5 to network fiber F1, thereby bypassing DEVICE 2.

As suggested by the simplified diagram shown in FIG. 1, conventional fiber-optics bypass switches are passive devices in the sense that they do not perform any optical/electrical conversion. However, these conventional fiber-optics bypass switches are typically very bulky, and require external packaging and power supplies to perform switching operations. For example, one popular type of conventional fiber-optics bypass switch includes mirrors and motors that physically position and align the various network and device fibers so that the necessary coupling/de-coupling operation is performed. The motors and associated mechanisms require a large housing, and assembly of the various parts and motors is tedious. Accordingly, these conventional fiber-optics bypass switches are expensive to produce, and require a relatively large amount of space to incorporate into a network. Further, because of the complex mechanisms used to position the fibers, these conventional fiber-optics bypass switches are difficult to modify in order to, for example, perform multiplexing functions instead of bypass switch functions.

It would therefore be desirable to have a fiber-optic microswitch that can be fabricated at low cost and with batch manufacturing processes similar to those of microelectronics, and can be easily modified to perform multiplexing operations in addition to bypass switch operations.

SUMMARY

The present invention provides a fiber-optic microswitch that uses a monocrystalline material, such as monocrystalline silicon, to form a flexible monocrystalline structure provided with a light-reflecting mirror that is positioned using electromagnetic force to reflect light between a series of stationary optical fibers. The monocrystalline structure includes an outer fixed (stationary) frame, a movable platform upon which the mirror is formed, and two or more resilient support members (e.g., monocrystalline silicon springs or torsion beams) connecting the movable platform to the fixed frame. Monocrystalline silicon has advantageous stiffness, durability, fatigue and deformation characteristics, and can be fabricated using known techniques to produce the monocrystalline structure. Accordingly, several highly reliable monocrystalline structures can be batch produced from a single silicon substrate, thereby minimizing manufacturing and assembly costs.

In accordance with another aspect of the present invention, the fiber-optic microswitch includes an electromagnetic drive mechanism for positioning the movable platform relative to the fixed frame by electromagnetic force. Another benefit of forming the movable platform, fixed frame and resilient support members using a monocrystalline structure is that the mirror (i.e., the movable platform) can be moved relative to the fixed frame using a relatively small driving force. Accordingly, the present invention is able to utilize an electromagnetic drive mechanism that reduces both the size and the cost of the present fiber-optic microswitch relative to conventional fiber-optic switches. The electromagnetic drive mechanism includes one or more coils formed on a drive substrate mounted under the monocrystalline structure, and one or more pole pieces, formed from a magnetic material, that are mounted on the movable platform. Currents are selectively applied to the coils to generate electromagnetic forces on the pole pieces, thereby causing the movable platform to move (e.g., tilt) relative to the fixed frame. When these currents are removed, the movable platform is returned to its original (idle) position by the resilient support members.

In accordance with a first disclosed embodiment of the present invention, a fiber-optic microswitch includes a monocrystalline substrate having a substantially square movable platform connected at its corners to a fixed frame by four serpentine silicon springs. A mirror is provided on an upper surface of the movable platform, and ferromagnetic (e.g., permalloy) pads are formed on a lower surface of the movable platform. A drive substrate is provided with four coils that are located below the ferromagnetic pads. A fiber assembly, including four fibers, is fixedly mounted over the mirror such that ends of the fibers face the mirror. The coils are wired in pairs such that a first pair of coils pulls down a first side of the movable platform in response to a first control signal, and a second pair of coils pulls down a second, opposite side of the movable platform in response to a second control signal. The fibers are positioned such that when the first side of the movable platform is pulled down, light from a first (input) fiber connected to a network is reflected into a second (receiver) fiber connected to a device, and light from a third (transmission) fiber connected to the device is reflected to a fourth (output) fiber connected to the network, thereby coupling the device into the network.

Conversely, when the second side of the movable platform is pulled down, light from the first (input) fiber is reflected into the fourth (output) fiber, thereby de-coupling the device from the network.

In accordance with a second disclosed embodiment of the present invention, a fiber-optic microswitch includes a monocrystalline substrate having a movable platform connected by a pair of resilient torsion beams to a fixed frame such that the movable platform is able to rotate (tilt) about an axis defined by the torsion beams. Similar to the first embodiment, a mirror is provided on an upper surface of the movable platform, and ferromagnetic (e.g., permalloy) pads are formed on a lower surface of the movable platform. The fiber-optic microswitch also includes a drive substrate and a fiber assembly that are similar to those used in the first embodiment. A first pair of the coils generate electromagnetic force that cause the movable platform to rotate (tilt) into a first position in response to a first control signal, and a second pair of the coils generate electromagnetic force that cause the movable platform to rotate (tilt) into a second position in response to a second control signal. Light from the network is reflected by the mirror to couple and de-couple a device in a manner similar to that described above with reference to the first embodiment.

In accordance with a third disclosed embodiment of the present invention, a fiber-optic microswitch includes a monocrystalline substrate having a beam-like movable platform connected by a pair of serpentine silicon springs to a fixed frame such that the movable platform is able to rotate (tilt) about an axis defined by the serpentine silicon springs. A vertical blade is integrally fabricated at a first end of the movable platform that includes first and second mirrors provided on opposite sides of the vertical blade. Four optical fibers are mounted on the fixed frame such that optical axes of the fibers are aligned in a plane, with two fibers being directed toward a first mirror and two fibers being directed toward the second plane. One or more pole pieces are formed on the first end (i.e., under the vertical blade) or under a second end of the movable platform, and one or more coils are positioned below the pole pieces to generate an electromagnetic force used to move the mirrors in and out of the plane. Accordingly, when the mirrors are in an equilibrium position (i.e., in the plane), light from a first (input) fiber connected to a network is reflected into a second (receiver) fiber connected to a device, and light from a third (transmission) fiber connected to the device is reflected to a fourth (output) fiber connected to the network, thereby coupling the device into the network. Conversely, when the movable platform is tilted down in response to a control signal, thereby moving the mirrors out of the plane, light from the first (input) fiber is directed into the fourth (output) fiber, thereby de-coupling the device from the network.

In addition to coupling and de-coupling devices to/from an optical network, the present invention provides a convenient platform for performing additional optical switching operations. For example, as disclosed in a fourth embodiment, the monocrystalline structure utilized in the first embodiment can be used to form a multiplexer (or de-multiplexer) by providing separate control signals to each coil mounted on the drive substrate. That is, by selectively controlling the electromagnetic force applied to the movable platform, the mirror is tilted in two perpendicular directions to greatly increase the number of fibers to which light is selectively reflected.

The present invention will be more fully understood in light of the following detailed description taken together with the drawings.

BRIEF DESCRIPTION OF THE DRAWINGS

FIG. 5 is a perspective view showing a fiber-optics microswitch according to a second embodiment of the present invention.

FIGS. 6(A) and 6(B) are simplified front elevation views showing opposing switch states of the fiber-optics microswitch of FIG. 5.

FIG. 7 is a perspective view showing a fiber-optics microswitch according to a third embodiment of the present invention.

FIG. 8 is a plan view showing the fiber-optics microswitch of FIG. 7.

FIGS. 9(A) and 9(B) are simplified front elevation views showing opposing switch states of the fiber-optics microswitch of FIG. 7.

DETAILED DESCRIPTION

Figure 1:
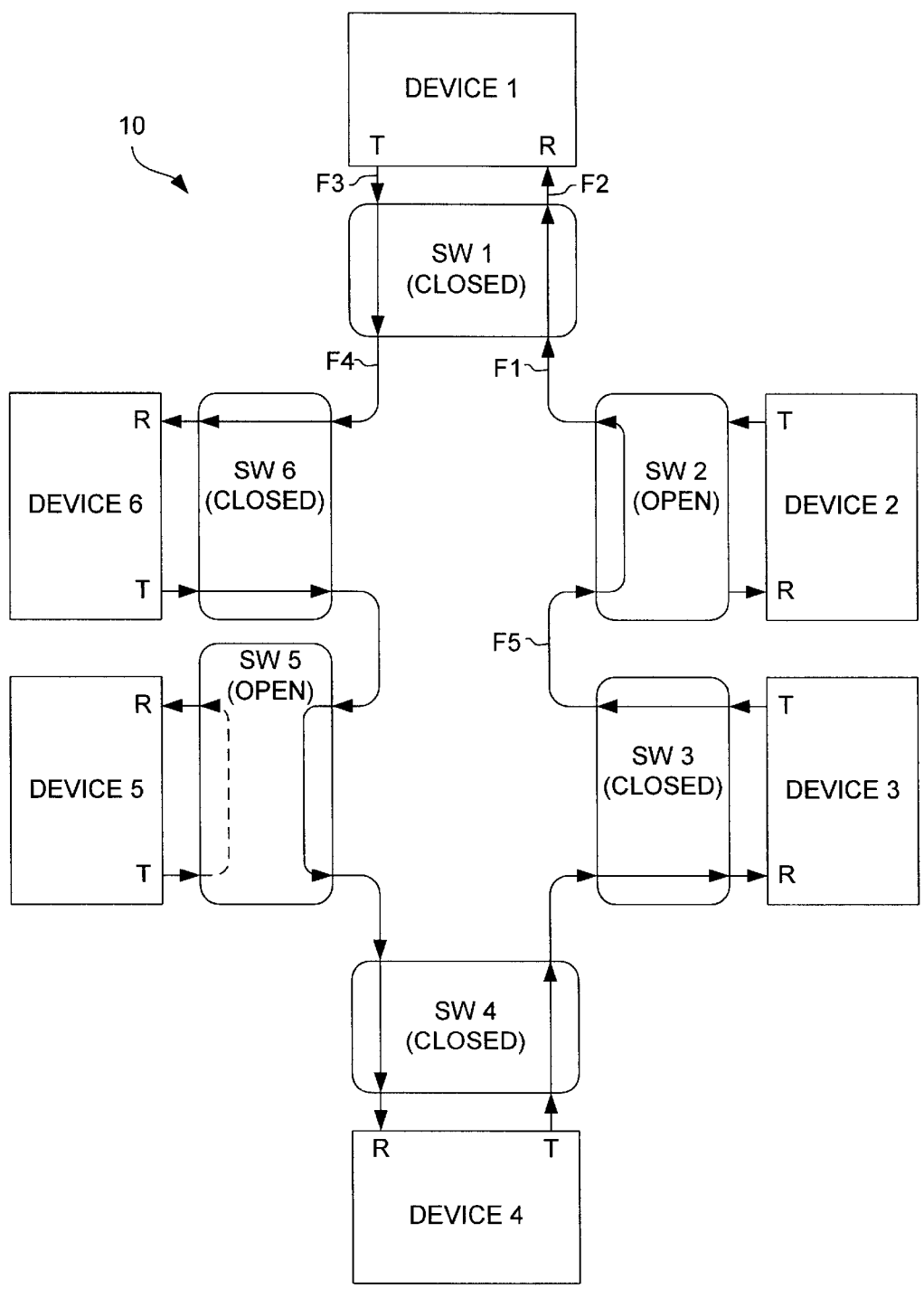
FIG. 1 is a block diagram showing a fiber-optics network using fiber-optics switches to couple and de-couple various devices.

The present invention provides a fiber-optic microswitch that includes a mirror positioning structure formed from a monocrystalline material, such as monocrystalline silicon, such that a mirror formed thereon is movable between two or more positions to selectively reflect light between stationary optical fibers. Such monocrystalline mirror positioning structures (referred to below simply as a "monocrystalline structure") can take many forms, as indicated by the various embodiments provided below. Due to its size and relative flexibility, the monocrystalline structure is moved between the various mirror positions using a space-saving electromagnetic motor. Three embodiments provided below describe bypass microswitches that can be utilized, for example, in the fiber-optics network shown in FIG. 1. However, the present invention is not necessarily limited to bypass microswitches, and may be used for other purposes, such as the fiber-optics multiplexer described in the fourth embodiment, below.

Definitions

In the following description and appended claims, the term "micromachined structure" is limited to structures formed using micromachining techniques (i.e., batch processes similar to those used for manufacturing microelectronic devices).

In addition, in the following description and appended claims, the phrase "monocrystalline structure" is intended to mean that a single monocrystalline substrate (e.g., silicon) is processed using micromachining techniques to form one or more structural parts (e.g., an outer frame and a movable platform connected to the outer frame). Similarly, the phrase "formed from a monocrystalline silicon substrate" is intended to mean that a single silicon crystal is processed using micromachining techniques (e.g., diffusing impurities into the monocrystalline silicon substrate and/or chemically etching the monocrystalline silicon substrate) to form one or more structural parts that comprise portions of the single silicon crystal.

First Embodiment

Figure 2A:
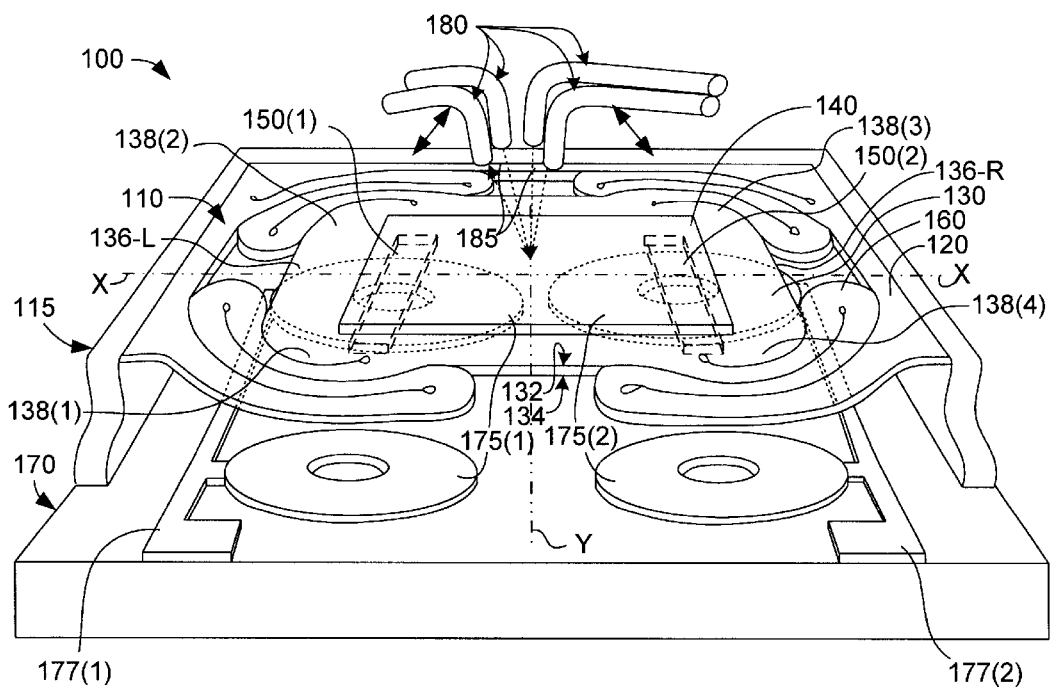
FIG. 2(A) is an isometric perspective view showing a fiber-optics microswitch according to a first embodiment of the present invention.

FIG. 2(A) is an isometric perspective view showing a fiber-optics micro-switch 100 according to a first embodiment of the present invention. Fiber-optics micro-switch 100 includes a monocrystalline mirror positioning structure 110, a drive substrate (structure) 170 mounted under monocrystalline structure 110 and connected to monocrystalline structure 110 by a positioning member 115, and several optical fibers 180 fixedly mounted over monocrystalline structure 110.

Monocrystalline structure 110 includes an outer fixed frame 120 surrounding a substantially square movable platform 130, and four in-plane serpentine microsprings (resilient support members) 160 connecting the four corners of movable platform 130 to outer fixed frame 120. In accordance with an aspect of the present invention, outer fixed frame 120, inner movable platform 130, and microsprings 160 are formed from a monocrystalline silicon substrate having a nominal thickness of 20 microns using established micromachining and silicon fabrication techniques. By fabricating these portions of monocrystalline structure 110 from a monocrystalline silicon substrate, monocrystalline structures 110 can be batch fabricated at minimal cost. Further, producing monocrystalline structure 110 in this manner avoids costly and time-consuming assembly and alignment of separate movable and fixed switch components, as is required in some conventional fiber-optic switch mechanisms.

Monocrystalline structure 110 is essentially identical to the structural member disclosed in co-owned U.S. Pat. No. 5,778,513, which is incorporated herein by reference in its entirety. U.S. Pat. No. 5,778,513 discloses a micro-relay in which the central platform includes a centrally-located pole piece that pulls the platform downward in response to a balanced electromagnetic force (i.e., such that the platform remains horizontal), thereby causing a contact pad provided on a bottom surface of the platform to bridge an underlying pair of contacts.

Although monocrystalline structure 110 is structurally similar to the structural member disclosed in U.S. Pat. No. 5,778,513, monocrystalline structure 110 includes features that facilitate the performance of optical switching functions that are not disclosed in U.S. Pat. No. 5,778,513. In particular, the present inventors recognized that, in addition to the z-axis translation of movable platform 130 in response to a balanced electromagnetic force, movable platform 130 is caused to pivot (tilt) around an x-axis and/or y-axis (which are perpendicular to each other and parallel the plane defined by movable platform 130) when an unbalanced electromagnetic force is applied to movable platform 130. To generate this pivot/tilt, one or more pole pieces 150 are located on bottom surface 134 along one or more edges of movable platform 130. In addition, drivers (e.g. electromagnetic coils 175) are provided on drive substrate 170 and are activated by control signals transmitted on traces 177 to move (tilt) moveable platform 130 relative to fixed frame 120, thereby selectively positioning mirror 140 in two or more positions, as described below. In particular, in one embodiment, pole piece 150(1) is provided along a left edge 136-L of movable platform 130, and is controlled by a first pair of coils 175(1) by applying an appropriate control signal to trace 177(1) to cause movable platform 130 to tilt counter-clockwise about the y-axis. Conversely, pole piece 150(2) is provided along a right edge 136-R of movable platform 130, and is controlled by a second pair of coils 175(2) by applying an appropriate control signal to trace 177(1) to cause movable platform 130 to tilt clockwise about the y-axis.

The present inventors also recognized that tilting movable platform 130 in this manner can be beneficially utilized to perform fiber-optic switching functions. Accordingly, mirror 140 is formed on upper surface 132 of movable platform 130, and four optical fibers 180 are fixedly positioned over upper surface 132. In one embodiment, optical fibers 180 are arranged in a housing (not shown) that is rigidly connected (as indicated by double-headed arrows) to fixed frame 120 (or positioning member 115) such that ends 185 of optical fibers 180 are automatically directed toward mirror 140 in an orientation described in detail below. By arranging the fibers in a suitable housing, assembly and alignment of fibers 180 relative to mirror 140 is greatly simplified.

Figure 2B:
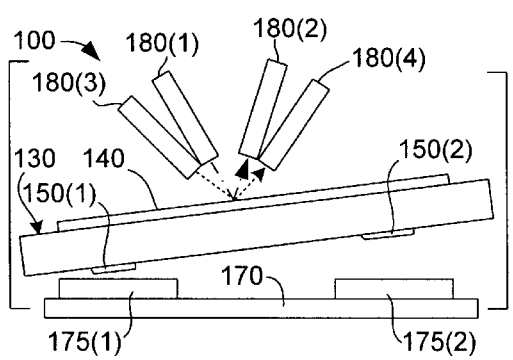
FIGS. 2(B) and 2(C) are simplified front elevation views showing opposing switch states of the fiber-optics microswitch of FIG. 2(A).
Figure 2C:
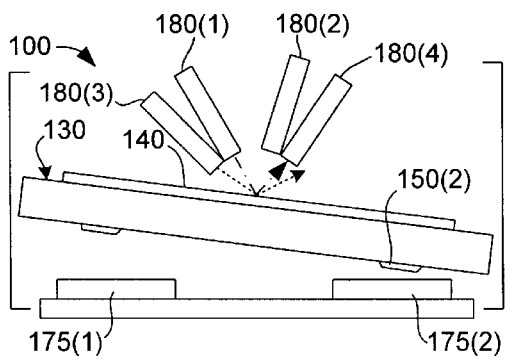

FIGS. 2(B) and 2(C) are simplified front elevation views showing the operation of fiber-optics micro-switch 100. In one embodiment, switch 100 is connected in a network similar to that shown in FIG. 1, and the optical fibers mentioned below are numbered in a manner consistent with the fibers indicated in FIG. 1.

Referring to FIG. 2(B), when a first control signal is applied to coil pair 175(1), an electromagnetic force is generated that pulls pole piece 150(1) downward, thereby tilting movable platform 130 counter-clockwise until movable platform 130 abuts a stop structure (not shown) that is provided on drive substrate 170, movable platform 130, or positioning member 115. As indicated in FIG. 2(B), in this first tilted position, mirror 140 reflects light transmitted through a first optical fiber 180(1) from, for example, an optical network, to a second optical fiber 180(2) that is connected, for example, to a device (not shown) in a manner similar to that shown in FIG. 1. In addition, mirror 140 reflects light transmitted through a third optical fiber 180(3) from the device to a fourth optical fiber 180(4) that is connected to the network. Accordingly, the device connected to second optical fiber 180(2) and third optical fiber 180(3) is coupled to receive information from and transmit information to the network (e.g., as indicated by switch SW1 in FIG. 1).

FIG. 2(C) shows a second switching position that occurs, when a second control signal is applied to coil pair 175(2) (the control signal to coil pair 175(1) is de-asserted), thereby generating an electromagnetic force that pulls pole piece 150(2) downward such that movable platform 130 is tilted clockwise until movable platform 130 abuts a stop structure (not shown). In this second tilted position, mirror 140 reflects light transmitted through first optical fiber 180(1) to fourth optical fiber 180(4). Note that light transmitted through third fiber 180(3) (if any) is reflected away from fourth fiber 180(4) and second fiber 180(2), thereby making fiber-optic micro-switch 100 a "blocking" type switch. Accordingly, the device is de-coupled from the network, and signals transmitted from transmission terminal T of the device are not passed back to reception terminal R of the device (e.g., as indicated by switch SW2 and DEVICE 2 in FIG. 1).

Several modifications to the specific features associated with fiber-optic micro-switch 100 are possible.

Figure 3A:
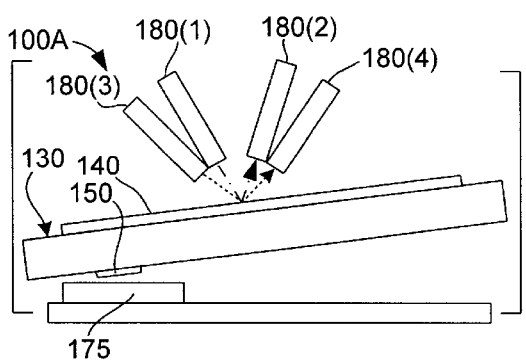
FIGS. 3(A) and 3(B) are simplified front elevation views showing a single-pole variation of the fiber-optics microswitch of FIG. 2(A).
Figure 3B:
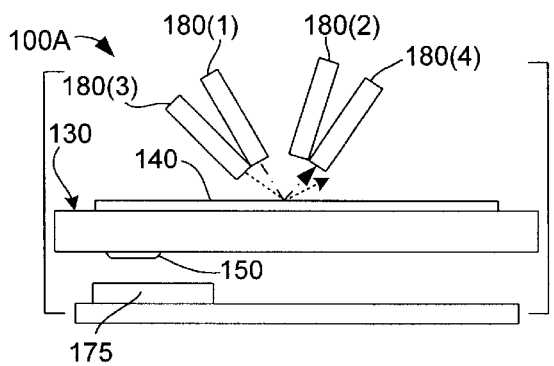

For example, as shown in FIGS. 3(A) and 3(B), a modified micro-switch 100A includes only one pole piece 150 and one coil pair 175. According to this variation, a first switch position is produced, as shown in FIG. 3(A), by applying a control signal to coil pair 175, thereby causing movable platform 130 to tilt in the manner described above. Conversely, when power to the device is terminated, the control signal to coil 175 is also terminated, and movable platform 130 returns to its equilibrium (horizontal) position), thereby causing mirror 140 to reflect light from first fiber 180(1) to fourth fiber 180(4) such that the network bypasses the device.

Figure 4A:
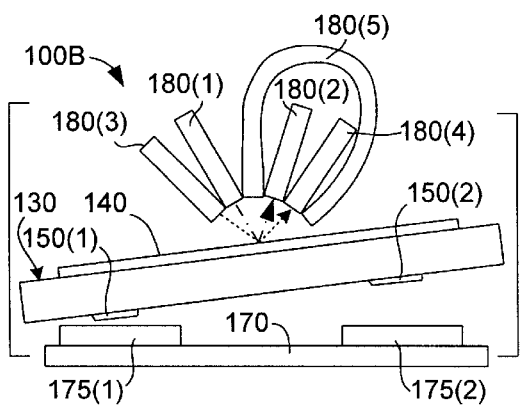
FIGS. 4(A) and 4(B) are simplified front elevation views showing a non-blocking variation of the fiber-optics microswitch of FIG. 2(A).
Figure 4B:
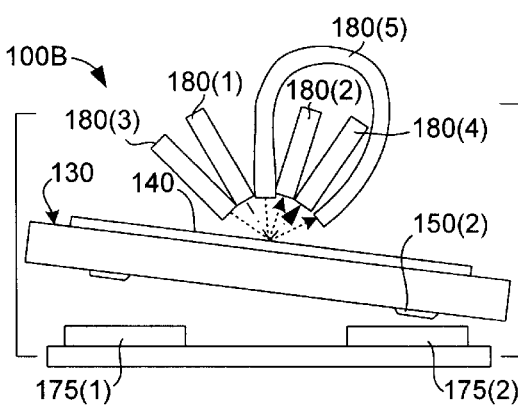

FIGS. 4(A) and 4(B) show a second modified micro-switch 100B that includes an additional (fifth) fiber 180(5) that is formed in a loop. As shown in FIG. 4(A), looped fiber 180(5) is not used in any path when switch 100B is in a first tilted position (i.e., mirror 140 reflects light transmitted through first optical fiber 180(1) to second optical fiber 180(2), and light transmitted through third optical fiber 180(3) to fourth optical fiber 180(4), thereby connecting a device to receive information from and transmit information to the network). However, as shown in FIG. 4(B), in the second tilted position light transmitted through third fiber 180(3) (if any) is transmitted by looped fiber 180(5), and then reflected off of mirror 140 to second fiber 180(2), thereby making fiber-optic micro-switch 100B a "non-blocking" type switch. Accordingly, the device is de-coupled from the network, and signals transmitted from transmission terminal T of the device are passed back to reception terminal R of the device (e.g., as indicated by switch SW5 and DEVICE 5 in FIG. 1).

Other modifications (not shown) are also possible. For example, referring again to FIG. 2(A), in the disclosed embodiment microsprings 160 are connected to the corners of movable platform 130. As discussed above, microsprings 160 are preferably formed from the same monocrystalline silicon substrate as that used to form fixed frame 120 and movable platform 130, thereby self-aligning each of these members and avoiding post-fabrication assembly costs. In an alternative embodiment (not shown), microsprings 160 are formed by depositing a suitable resilient material on a monocrystalline silicon substrate before forming fixed frame 120 and movable platform 130, thereby providing the self-alignment benefit without using integral silicon microsprings.

Second Embodiment

FIG. 5 is a perspective view showing a fiber-optics microswitch 200 according to a second embodiment of the present invention. Fiber-optics microswitch 200 includes a monocrystalline mirror positioning structure 210, a drive substrate (structure) 270 mounted under monocrystalline structure 210, and several optical fibers 280 fixedly mounted over monocrystalline structure 210.

Monocrystalline structure 210 includes an outer fixed frame 220 surrounding a movable platform 230, and two torsion beams (resilient support members) 260 connecting opposite ends of movable platform 230 to outer fixed frame 220 and defining an axis of rotation (y-axis). Note that first gaps 225 are provided on each side of movable platform 230, and second gaps 228 are provided at each end, thereby providing sufficient room for movable platform 230 to pivot relative to outer fixed frame 220. As in the first embodiment (described above), outer fixed frame 220, inner movable platform 230, and torsion beams 260 are formed from a monocrystalline silicon substrate having a thickness of approximately 60 μm using established micromachining and silicon fabrication techniques. Similar to the first embodiment, by fabricating these portions of monocrystalline structure 210 from a monocrystalline silicon substrate, monocrystalline structures 210 can be batch fabricated at minimal cost. Further, producing monocrystalline structure 210 in this manner avoids costly and time-consuming assembly and alignment of separate movable and fixed switch components, as is required in some conventional fiber-optic switch mechanisms.

Monocrystalline structure 210 is essentially identical to the structural member disclosed in co-owned and co-pending U.S. patent application Ser. No. 09/366,428 ("the '428 application"), which was filed on Aug. 2, 1999, and is incorporated herein by reference in its entirety. The '428 application discloses an opto-mechanical microswitch in which a {111} plane of the monocrystalline silicon substrate provides a vertical mirror when an inner frame is pivoted about the beams. When pivoted in this manner, the vertical wall is used to reflect light from a first fiber to a second fiber. When the inner frame returns to its lowered position, the light from the first fiber is passed to a third fiber.

Although monocrystalline structure 210 is structurally similar to the structural member disclosed in the '428 application, monocrystalline structure 210 differs in that it includes a substantially solid movable platform 230 (i.e., the inner frame disclosed in the '428 is hollow), and includes a horizontal mirror 240 formed on an upper surface 232 of movable platform 230.

FIGS. 6(A) and 6(B) are simplified cross-sectional views taken along section line 6—6 of FIG. 5. In one embodiment, microswitch 200 is connected in a network similar to that shown in FIG. 1, and the optical fibers mentioned below are numbered in a manner consistent with the fibers indicated in FIG. 1.

Referring to FIGS. 6(A) and 6(B), movable platform 230 is caused to pivot (tilt) around the y-axis by providing pole pieces 250(1) and 250(2) (e.g., permalloy) on a bottom surface 234 of movable platform 230 along edges 236-L and 236-R, respectively. In addition, electromagnetic coils 275(1) and 275(2) are provided on drive substrate 270 and positioned below pole pieces 250(1) and 250(2), respectively. Similar to the first embodiment, electromagnetic coils 275(1) and 275(2) are activated by separate control signals to generate an electromagnetic force that pulls downward on pole pieces 250(1) and 250(2), thereby causing moveable platform 230 to pivot (tilt) around beams 260 relative to fixed frame 220, thereby selectively positioning mirror 240 in two or more positions.

In particular, as shown in FIG. 6(A), when a first control signal is applied to coil 275(1) (which is aligned along left edge 236-L of movable platform 230), an electromagnetic force is generated that pulls pole piece 250(1) downward (toward coil 275(1)), thereby pivoting movable platform 230 counter-clockwise until movable platform 230 abuts a stop structure (not shown) that is provided on drive substrate 270 (or movable platform 230). As indicated in FIG. 6(A), in this first tilted position, mirror 240 is positioned to reflect light transmitted through a first optical fiber 280(1) from, for example, an optical network, to a second optical fiber 280(2) that is connected, for example, to a device (not shown) in a manner similar to that shown in FIG. 1. In addition, mirror 240 reflects light transmitted through a third optical fiber 280(3) from the device to a fourth optical fiber 280(4) that is connected to the network. Accordingly, the device connected to second optical fiber 280(2) and third optical fiber 280(3) is coupled to receive information from and transmit information to the network (e.g., as indicated by switch SW1 in FIG. 1).

FIG. 6(B) shows a second switching position that occurs when a second control signal is applied to coil 275(2) (the control signal to coil 275(1) is de-asserted), thereby generating an electromagnetic force that pulls pole piece 250(2) downward such that movable platform 230 is tilted clockwise until movable platform 230 abuts a stop structure (not shown). In this second tilted position, mirror 240 reflects light transmitted through first optical fiber 280(1) to fourth optical fiber 280(4). Note that light transmitted through third fiber 280(3) (if any) is reflected off into space. Accordingly, the device is de-coupled from the network (e.g., as indicated by switch SW2 in FIG. 1).

Several modifications to the specific features associated with fiber-optic microswitch 200 are possible. For example, similar to the modification of the first embodiment shown in FIGS. 4(A) and 4(B), microswitch 200 can be modified to include only one pole piece and one coil. According to this variation, one of the switch positions would be implemented when movable platform 230 is in an idle, horizontal position (i.e., as shown in FIG. 5). Further, additional functions disclosed in the '428 application can be performed by fiber-optic microswitch 200 by providing mirrors on edges 236-L and 236-R, as taught in the '428 application. Other modifications to beams 260 that are taught in the '428 application are also possible.

Third Embodiment

FIG. 7 is an isometric perspective view showing a fiber-optics microswitch 300 according to a third embodiment of the present invention. Fiber-optics microswitch 300 includes a monocrystalline mirror positioning structure 310, a drive substrate (structure) 370 mounted under monocrystalline structure 310 and connected to monocrystalline structure 310 by positioning members (e.g., adhesive or sapphire spheres) 315, which are received in etched positioning cavities, and four optical fibers 380(1) through 380(4).

Monocrystalline structure 310 includes an outer fixed frame 320 surrounding a elongated, beam-like movable platform 330, and two in-plane serpentine microspring elements (resilient support members) 360 connecting opposing sides of movable platform 330 to outer fixed frame 320. Similar to the first and second embodiments, outer fixed frame 320, inner movable platform 330, and spring elements 360 are formed from a monocrystalline silicon substrate having a nominal thickness of 400 microns using micromachining and silicon fabrication techniques similar to those used in the first and second embodiments, described above. Accordingly, the batch fabrication and cost saving benefits, which are described above with reference to the first and second embodiments, also apply to the third embodiment.

In accordance with the third embodiment, outer fixed frame 320 is etched using known techniques to form a series of grooves 325 for receiving fibers 380(1) through 380(4). Accordingly, fibers 380(1) through 380(4) are easily mounted onto the top surface of outer fixed frame 320 in a proper alignment that facilitates the switching operations described below.

In addition, the free end of movable platform 330 is provided with an upright vertical blade 340. Vertical blade 340 is formed by applying anisotropic chemical etchant to a <100> silicon substrate, thereby providing opposing vertical mirror surfaces 340(1) and 340(2) along the so-called {111} crystalline plane such that vertical mirror surfaces 340(1) and 340(2) are automatically optically smooth. If needed, a thin metal layer can be deposited on vertical mirror surfaces 340(1) and 340(2) to ensure adequate reflectivity.

Also provided on the free end of movable platform 330 is a flange 333 that is used to support a pole piece 350 (shown in FIGS. 9(A) and 9(B), discussed below). Flange 333 can be formed using the same mask as that used to form serpentine microspring elements 360.

As indicated in FIG. 8, fibers 380(1) through 380(4) are mounted on opposite sides of vertical blade 340. In particular, network fibers 380(1) and 380(4) are mounted on a first leg of fixed frame 320 and positioned such that they face vertical mirror surface 340(1), and device fibers 380(2) and 380(3) are positioned such that they face vertical mirror surface 340(2). Note that coil 375 is located directly below flange 333, which is located at the free end of movable platform 330, thereby facilitating rotation of movable platform 330 (via microsprings 360) relative to fixed frame 320.

FIGS. 9(A) and 9(B) are simplified elevation views showing the operation of fiber-optics microswitch 300. In one embodiment, microswitch 300 is connected in a network similar to that shown in FIG. 1, and the optical fibers mentioned below are numbered in a manner consistent with the fibers indicated in FIG. 1.

Referring to FIG. 9(A), during normal operation (i.e., when the device is coupled to the network), a control signal is applied to coil 375, thereby generating an electromagnetic force that pulls down the free end of movable platform 330 (e.g., until pole piece 350 contacts coil 375). In this switch condition, vertical blade 340 is pulled below the optical axis of the fibers, thereby allowing light transmitted from network fiber 380(1) to be received by device fiber 380(2), and light transmitted from device fiber 380(3) to be received by network fiber 380(4) (as indicated by the heavy dashed arrows in FIG. 8).

Referring to FIG. 9(B), when device is de-coupled from the network (e.g., when power to the device is terminated), the control signal applied to coil 375 is de-asserted, thereby releasing the electromagnetic force and causing the free end of movable platform 330 to move upward due to the bias applied by microsprings 360 (shown in FIGS. 7 and 8). In this switch condition, vertical blade 340 is aligned with the upper surface of outer fixed frame 320, thereby causing light transmitted from network fiber 380(1) to be reflected by mirror surface 340(1) to network fiber 380(4), and light (if any) transmitted from device fiber 380(3) to be reflected by mirror surface 340(2) to network fiber 380(2) (as indicated by the light dashed arrows in FIG. 8). Accordingly, the device connected to device fibers 380(2) and 380(3) is de-coupled from the network (as indicated by switch SW5 in FIG. 1).

Several modifications to the specific features associated with fiber-optic microswitch 300 are possible. For example, in an alternative embodiment intended to increase the vertical movement of the vertical blade, the movable platform is formed as a lever with the microsprings connected to a central portion of the elongated movable platform, and the pole piece mounted at an end opposite the vertical blade. In accordance with another modification, the fibers are re-arranged such that light from the input network fiber is reflected by a mirror surface to a device receiver fiber when the vertical blade is in the upright position (e.g., as shown in FIG. 9(A)). Other modifications (not shown) are also possible.

Fourth Embodiment

In addition to coupling and de-coupling devices to/from an optical network, the present invention provides a convenient platform for performing additional optical switching operations, such as selectively directing a light beam from an input fiber to any of several output fibers. This multiplexing function is described below with reference to a particular embodiment that is intended only to be illustrative of the various additional switching operations that can be performed in accordance with the present invention.

Figure 10:
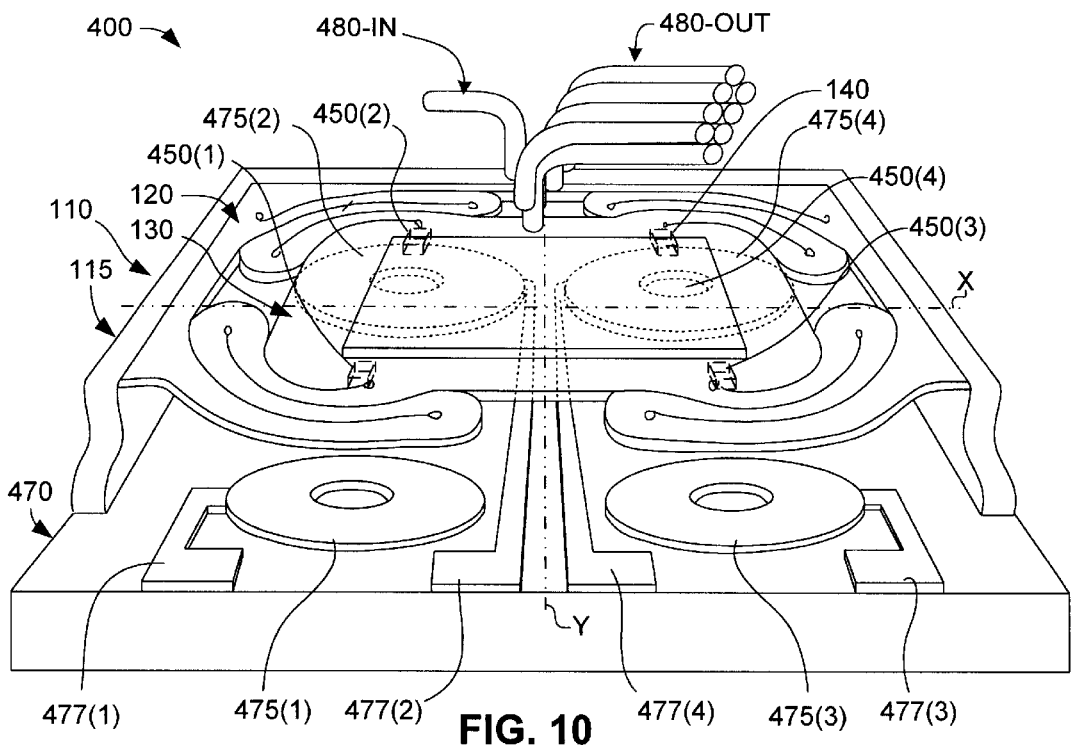
FIG. 10 is a perspective view showing a fiber-optics multiplexing microswitch according to a fourth embodiment of the present invention.

FIG. 10 is an isometric perspective view showing a fiber-optics multiplexer 400 including monocrystalline mirror positioning structure 110, a drive substrate (structure) 470 mounted under monocrystalline structure 110 and connected to monocrystalline structure 110 by positioning member 115, an input optical fiber 480-IN, and several output optical fibers 480-OUT. Note that input optical fiber 480-IN and output optical fibers 480-OUT are pre-arranged in a housing (not shown) prior to mounting over monocrystalline structure 110.

Monocrystalline structure 110, which is described in additional detail above with reference to the first embodiment, includes an outer fixed frame 120 surrounding a substantially square movable platform 130, and four in-plane serpentine microspring elements 160 connecting the four corners of movable platform 130 to outer fixed frame 120. As in the first embodiment, mirror 140 is formed on the upper surface of movable platform 130.

The electromagnetic motor provided on fiber-optics multiplexer 400 differs from that of fiber-optics microswitch 100 (described above) to facilitate moving mirror 140 between more than two positions. In particular, four pole pieces 450(1) through 450(4) are formed on a lower surface of movable platform 130 such that they are located over four coils 475(1) through 475(4) that are provided on drive substrate 470. Each coil 475(1) through 475(4) is connected to a corresponding trace 477(1) through 477(4) (along with a corresponding ground connection, not shown), thereby allowing individual activation of coils 475(1) through 475 (4). As described below, this ability to individually activate coils 475(1) through 475(4) facilitates rotation (tilting) of movable platform 110 around both the x-axis and the y-axis shown in FIG. 10.

Figure 11A:
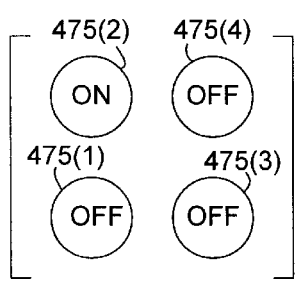
FIGS. 11(A) through 11(C) are simplified diagrams illustrating examples of control signals applied to the electromagnetic coils of the multiplexing microswitch shown in FIG. 10.
Figure 11B:
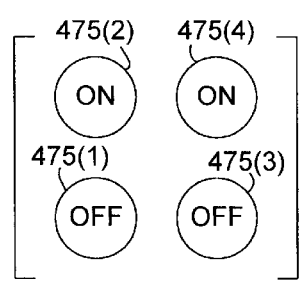
Figure 11C:
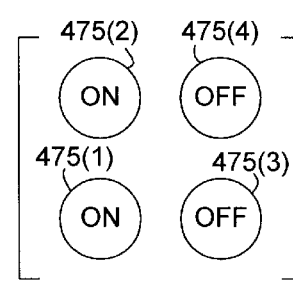

FIGS. 11(A) through 11(C) are simplified diagrams illustrating examples of control signals applied to coils 475(1) through 475(4) of the fiber-optics multiplexer 400. In particular, when a control signal is applied to a particular coil (e.g., coil 475(2) in FIG. 11(A)), that coil is identified with the word "ON". Conversely, when the control signal to a particular coil is de-asserted (e.g., coil 475(4) in FIG. 11(A)), that coil is identified with the word "OFF". In accordance with this convention, FIG. 11(A) depicts a control signal pattern in which coil 475(2) is turned on, and coils 475(1), 475(3), and 475(4) are turned off. In this state, electromagnetic force is applied to pole piece 450(2) (see FIG. 10), thereby pulling down on the back left corner of movable platform 130. Similarly, FIG. 11(B) depicts a control signal pattern in which coils 475(2) and 475(4) are turned on, and coils 475(1) and 475(3) are turned off. In this state, electromagnetic force is applied to pole pieces 450(2) and 450(4) (see FIG. 10), thereby pulling down on the back half of movable platform 130 (i.e., such that movable platform 130 is tilted back around the x-axis). Finally, FIG. 11(C) depicts a control signal pattern in which coils 475(1) and 475(2) are turned on, and coils 475(3) and 475(4) are turned off. In this state, electromagnetic force is applied to pole pieces 450(1) and 450(2) (see FIG. 10), thereby pulling down on the left half of movable platform 130 (i.e., such that movable platform 130 is tilted counter-clockwise around the y-axis).

Figure 12A:
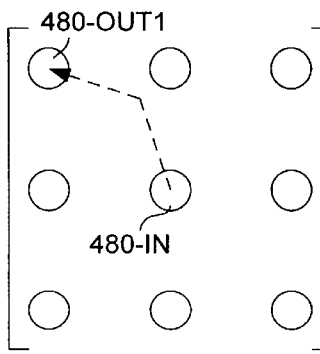
FIGS. 12(A) through 12(C) are simplified diagrams illustrating reflected light paths in accordance with the control signal patterns shown in FIGS. 11(A) through 11(C), respectively.
Figure 12B:
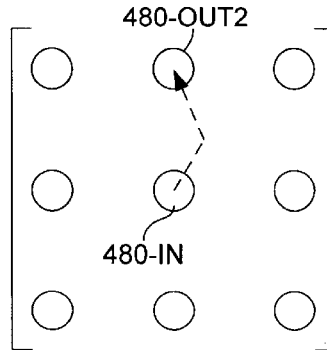
Figure 12C:
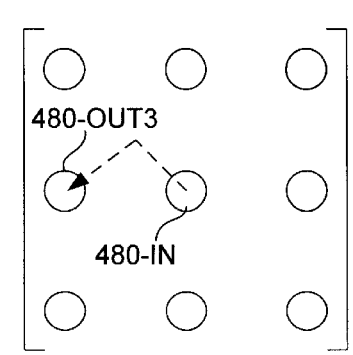

FIGS. 12(A) through 12(C) are simplified diagrams illustrating reflected light paths in accordance with the control signal patterns shown in FIGS. 11(A) through 11(C), respectively. In particular, each figure illustrates a path of light emitted from input fiber 480-IN to an output fiber 480-OUT as reflected by mirror 140 (see FIG. 10), which is positioned in accordance with the control signals applied as shown in FIGS. 11(A) through 11(C). For example, in accordance with the application of a control signal to coil 475(2) (as shown in FIG. 11(A)), the back left corner of movable platform 110 is tilted downward. Referring to FIG. 12(A), this mirror position causes light emitted from input fiber 480-IN to be reflected into output fiber 480-OUT1. Similarly, in accordance with the application of a control signal to coils 475(2) and 275(4) (as shown in FIG. 11(B)), the back left half of movable platform 110 is tilted downward (i.e., both the left and right back corners are pulled down). Referring to FIG. 12 (B), this mirror position causes light emitted from input fiber 480-IN to be reflected into output fiber 480-OUT2. As a final example, in accordance with the application of a control signal to coils 475(1) and 275(2) (as shown in FIG. 11(C)), the left half of movable platform 110 is tilted counter-clockwise (i.e., both the left back and left front corners are pulled down). Referring to FIG. 12(C), this mirror position causes light emitted from input fiber 480-IN to be reflected into output fiber 480-OUT3. As can be understood from these examples, a single input signal transmitted on input fiber 480-IN is selectively multiplexed to any of the eight output fibers 480-OUT by selectively applying corresponding patterns of control signals to coils 475(1) through 475(4). Of course, fiber-optics multiplexer 400 is not necessarily limited to eight output fibers. Other modifications are also possible.

Although the invention has been described in connection with several embodiments, it is understood that this invention is not limited to the embodiments disclosed, but is capable of various modifications that would be apparent to a person skilled in the art. Thus, the invention is limited only by the following claims.

What is claimed is:

1. A fiber-optic micro-switch comprising:
   a monocrystalline structure including a fixed outer frame, a movable platform having a mirror and a first pole piece formed thereon, and a resilient support structure connected between the fixed frame and the movable platform;
   a drive structure connected to the fixed frame of the mirror structure and including a first electromagnetic coil located adjacent to the first pole piece; and
   a plurality of optical fibers connected to the fixed frame of the mirror structure such that ends of the optical fibers are directed toward the mirror.

2. The fiber-optic micro-switch according to claim 1, wherein the mirror comprises a metal layer formed on the movable platform.

3. The fiber-optic micro-switch according to claim 1, wherein the first pole piece comprises electromagnetic material formed on a lower surface of the movable platform.

4. The fiber-optic micro-switch according to claim 1, wherein the first electromagnetic coil comprises a conductive material formed in a spiral shape on an upper surface of a drive substrate.

5. The fiber-optic micro-switch according to claim 1,
   wherein the movable platform of the monocrystalline structure comprises a square pad having an upper surface, a lower surface, and four corners,
   wherein the mirror is formed on the upper surface of the movable platform, wherein the first pole piece is formed on the lower surface of the movable platform, and wherein the resilient support structure comprises four serpentine silicon springs connecting the four corners of the movable platform to the fixed outer frame.

6. The fiber-optic micro-switch according to claim 5, wherein the plurality of optical fibers include first, second, and third optical fibers fixedly connected to the fixed outer frame such that ends of the first, second, and third optical fibers are located adjacent to the mirror;

wherein when a first control signal is applied to the first electromagnetic coil, an electromagnetic force is generated that pulls the first pole piece, thereby tilting the movable platform into a first position in which the mirror reflects light transmitted through the first optical fiber to the second optical fiber, and wherein when the first control signal is terminated, the movable platform is moved into a second position in which the mirror reflects light transmitted through the first optical fiber to the third optical fiber.

7. The fiber-optic micro-switch according to claim 6, wherein the plurality of optical fibers further include a fourth optical fiber, and wherein when the movable platform is in the first position, the mirror reflects light transmitted through the fourth optical fiber to the third optical fiber.

8. The fiber-optic micro-switch according to claim 6, wherein the first pole piece is located adjacent to a first edge of the movable platform, wherein the monocrystalline structure further includes a second pole piece formed on the movable platform and located adjacent to a second edge of the movable platform, wherein the drive structure further includes a second electromagnetic coil located under the second pole piece.

9. The fiber-optic micro-switch according to claim 8, wherein the plurality of optical fibers include first, second, and third optical fibers fixedly connected to the fixed outer frame such that ends of the first, second, and third optical fibers are located adjacent to the mirror;

wherein when a first control signal is applied to the first electromagnetic coil, a first electromagnetic force is generated that pulls the first pole piece, thereby tilting the movable platform into a first position in which the mirror reflects light transmitted through the first optical fiber to the second optical fiber, and wherein when a second control signal is applied to the second electromagnetic coil, a second electromagnetic force is generated that pulls the second pole piece, thereby tilting the movable platform into a second position in which the mirror reflects light transmitted through the first optical fiber to the third optical fiber.

10. The fiber-optic micro-switch according to claim 9, wherein the plurality of optical fibers further include a fourth optical fiber, and wherein when the movable platform is in the first position, the mirror reflects light transmitted through the fourth optical fiber to the third optical fiber.

11. A fiber-optics micro-switch comprising:

a base structure including an outer frame, a movable platform having a mirror formed thereon, and a resilient support member connecting the outer frame to the movable platform;

an electromagnetic motor including a fixed portion mounted adjacent the movable platform and a movable portion mounted on the movable platform; and first, second, and third optical fibers fixedly connected to the outer frame such that ends of the first, second, and third optical fibers are located adjacent to the mirror;

wherein when the electromagnetic motor exerts a first driving force on the movable platform, the movable platform is positioned such that the mirror reflects light from the first optical fiber to the second optical fiber, and wherein when the electromagnetic motor exerts a second driving force on the movable platform, the movable platform is positioned such that the mirror reflects light from the first optical fiber to the third optical fiber.

12. A fiber-optics micro-switch comprising:

a base structure formed from a monocrystalline silicon wafer and including an outer frame, a movable platform having a mirror formed thereon, and a resilient support member connecting the outer frame to the movable platform;

first, second, and third optical fibers fixedly connected to the outer frame such that ends of the first, second, and third optical fibers are located adjacent to the mirror; and means for moving the movable platform relative to the outer frame such that when the movable platform is in a first position, the mirror reflects light emitted from the first optical fiber to the second optical fiber, and when the movable platform is in a second position, the mirror reflects light emitted from the first optical fiber to the third optical fiber.

* * * * *